United States Patent [19]

LaVoie

[11] Patent Number: 4,862,102
[45] Date of Patent: Aug. 29, 1989

[54] METHOD AND APPARATUS FOR MINIMIZING THE SELF HEATING DISTORTION OF A COMPENSATED DIFFERENTIAL TRANSCONDUCTANCE AMPLIFIER

[75] Inventor: Marvin E. LaVoie, Aloha, Oreg.

[73] Assignee: Tektronix, Inc., Beaverton, Oreg.

[21] Appl. No.: 129,570

[22] Filed: Jan. 29, 1988

[51] Int. Cl.⁴ .......................... H03F 3/45; H03F 3/04
[52] U.S. Cl. .................................... 330/256; 330/289
[58] Field of Search ............... 330/149, 207, 252, 256, 330/289

[56] References Cited

U.S. PATENT DOCUMENTS 3,727,146  4/1973  Hughes .............................. 330/256

*Primary Examiner*—Gene Wan

[57] ABSTRACT

A method and apparatus for minimizing the self heating distortion of a compensated differential transconductance amplifier having an error voltage generator is provided. In a preferred embodiment, the bases of a first pair of transistors are coupled together and to an adjustment voltage source. The bases of a second pair of transistors are coupled together and to a reference voltage source. The collectors of the transistor pairs are coupled together to form a differential current output. The output currents of the compensated amplifier are segregated into two currents, one originating in the error voltage generator, a second current being the remainder. The first current is directed to flow through the first pair of transistors, the second current is directed to flow through the second pair of transistors. By varying the adjustment voltage, the power of the error voltage generator is independently varied, which in turn adjusts the thermal characteristics of the amplifier, in order that a minimum amount of thermal distortion may be obtained.

5 Claims, 5 Drawing Sheets

METHOD AND APPARATUS FOR MINIMIZING THE SELF HEATING DISTORTION OF A COMPENSATED DIFFERENTIAL TRANSCONDUCTANCE AMPLIFIER The present invention relates to transistorized differential transconductance amplifiers, and more particularly to the adjustment of the self heating distortion inherent in differential amplifiers which are compensated in some manner to reduce nonlinear error currents.

U.S. Pat. Re. No. 31,545 teaches a linearized differential amplifier which is now known as a "cascomp" amplifier. The amplifier includes a main differential amplifier, a common base stage which generates an error voltage, and an error amplifier which senses the error voltage produced by the common base stage and generates an error current of opposite polarity to the error current produced by the main differential amplifier. The signal current and the error amplifier current are summed resulting in a linear output current.

U.S. Pat. No. 4,267,516 teaches another linearized differential amplifier which is a compensated "$f_T$ doubler" amplifier. The amplifier includes two coupled main differential amplifiers wherein a transistor from each main differential amplifier generates an error voltage, and an error amplifier which senses the error voltage and generates an error current of opposite polarity to the error currents produced by the two main differential amplifiers. As in the cascomp amplifier, the currents are summed which results in a linear output current.

Computer simulations of the two prior art circuits prove that a substantial increase in linearity is achieved over uncompensated amplifiers. However, when the amplifiers are actually built in an integrated circuit, the improvement in linearity is degraded by residual self heating distortion. That is, in response to an input voltage step, the prior art circuits achieve the desired output voltage step predicted by simulation results, but the output voltage drifts with time as the thermal gradients of the transistors change.

The problem of thermal distortion is exacerbated due to other integrated circuit design considerations. The two prior art design techniques rely upon precise matching of thin film resistors to achieve optimum linearity. In practice, the thin film resistor matching may be 10% or more. Also, constraints on integrated circuit die size limits the area which may be used by the thin film resistors, which further decreases matching tolerances. Mismatches between transistor emitter base voltage and beta also adversely affect thermal distortion. The layout of the integrated circuit itself may produce thermal gradients which introduce further error and are extremely difficult to predict by electrical simulations. Finally, thermal distortion may be produced by the error amplifiers themselves.

A brief analysis of a differential pair of transistors with collector and emitter resistors may help to illustrate the problem of thermal distortion. Such a simple differential pair of transistors is shown in FIG. 1. If the input voltage applied to the differential pair of transistors has no differential component, each transistor will dissipate the same amount of power. However, when a differential signal is applied, each transistor will dissipate a different amount of power, and each will reach a new operating temperature. This transition takes a finite amount of time, and is the cause of the thermal distortion.

The phenomenon of thermal distortion may be described by a few pertinent equations. The difference in power between the two transistors in FIG. 1 is given by:

$$dP = 2 \cdot dI \cdot (V_{CE} - I_C \cdot R_L)$$

Where:
 dP is the differential power
 dI is the differential collector current
 $V_{CE}$ is the quiescent collector to emitter voltage
 $I_C$ is the quiescent collector current
 $R_L$ is the total load resistance.

The difference in the emitter base voltages of the two transistors is given by:

$$dV_{BE} = 2 \cdot dI \cdot (V_{CE} - I_C \cdot R_L) \cdot k$$

Where:
 $dV_{BE}$ is the net change in the emitter base voltage due to heating and cooling after the change in current occurs.
 k is a thermal constant which is equal to the product of the temperature coefficient of the emitter base junction voltage and the thermal resistance of the transistor.

Substituting the collector and emitter resistances of the simple differential pair of FIG. 1, it is possible to calculate expressions for both the signal output voltage and the output voltage due to the thermal distortion.

$$V_O = 2 \cdot dI \cdot R_C$$

$$V_{DIST} = dV_{BE} \cdot R_C / R_E.$$

The thermally distorted step response is shown in FIG. 2, wherein the contributions due to the predicted output voltage and the thermally distorted output voltage are plotted as a function of time.

What is desired is a method for minimizing the self heating distortion of a compensated amplifier which may be easily implemented in an integrated circuit.

SUMMARY OF THE INVENTION

According to the present invention, a method and apparatus for minimizing the self heating distortion of a compensated differential transconductance amplifier is provided. The present invention provides an improvement over prior art compensated amplifiers in that the thermal error is not fixed as a function of device matching and layout of the integrated circuit. Integrated circuit characteristics may be easily compensated and nearly optimum predicted performance may be achieved.

In a preferred embodiment of the present invention, the bases of a first pair of transistors are coupled together to an adjustment voltage source. The bases of a second pair of transistors are coupled together to a reference voltage source. The collectors of the transistor pair are coupled together to form a differential current output.

In many prior art linearity compensation techniques, an error voltage generator and an error amplifier are employed. Usually, the current flowing through the error voltage generator and the rest of the amplifier are summed and form the differential current output. In the present invention, however, the current flowing through the error voltage generator is separated from the rest of the amplifier output current. The error voltage generator current is channeled to the emitters of the first pair of transistors and the rest of the output current is channeled to the emitters of the second pair of transistors.

In this way, the power to the error voltage generator may be independently controlled by the adjustment voltage. Adjusting the power dissipation of the error voltage generator alters the error voltage produced. This, in turn, determines the thermal characteristics of the error current produced by the error amplifier. More or less thermal error current may be required depending on the integrated circuit characteristics and thermal distortion may be virtually minimized.

DESCRIPTION OF THE PREFERRED EMBODIMENT

Figure 4:
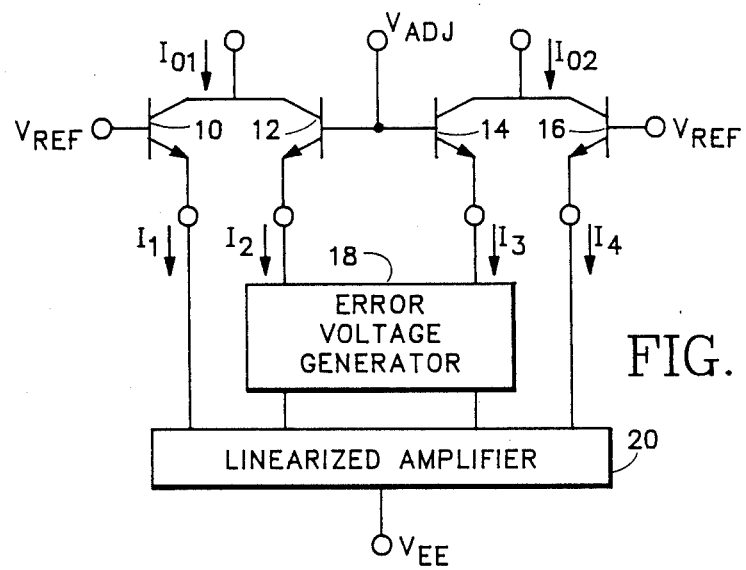
FIG. 4 is a schematic diagram of the preferred embodiment in accordance with the present invention.

Referring to FIG. 4, the method and apparatus for adjusting linearity according to the present invention includes a first pair of transistors 12 and 14 and a second pair of transistors 10 and 16. The bases of transistors 12 and 14 are coupled together to an adjustment voltage designated $V_{ADJ}$. The bases of transistors 10 and 16 are coupled together to a reference voltage designated $V_{REF}$. The collectors of transistors 10 and 12 are coupled together and the collectors of transistors 14 and 16 are coupled together; the difference of the two summed collectors currents being the differential output current of the compensated amplifier.

Error voltage generator 18 and linearized amplifier 20 represent a linearized amplifier which is compensated in some manner for linearity by an error amplifier (not shown). The output current flowing through the error voltage generator and the rest of the output current are usually summed together to form the differential output current of the amplifier. In the present invention, the current flowing through the error voltage generator 18 is segregated and is represented by the currents $I_2$ and $I_3$. The rest of the differential output current is designated $I_1$ and $I_4$. The present invention is configured such that the current flowing through the error voltage generator 18 flows through the first pair of transistors 12 and 14 and the rest of the current flows through the second pair of transistors 10 and 16.

The segregation of currents in the compensated amplifier in conjunction with the variable adjustment voltage enable the voltage, and therefore the power, of the error voltage generator to be independently varied. Since power is proportional to temperature, and the emitter base voltages of the transistors within the error voltage generator are proportional to temperature, controlling the power of the error voltage generator controls the amount of error voltage produced by the error voltage generator.

An independently variable error voltage is desirable, since this voltage determines the output of the error amplifier. In effect, the voltage adjustment source $V_{ADJ}$ determines how much thermal error current is produced by the error amplifier.

Figure 1:
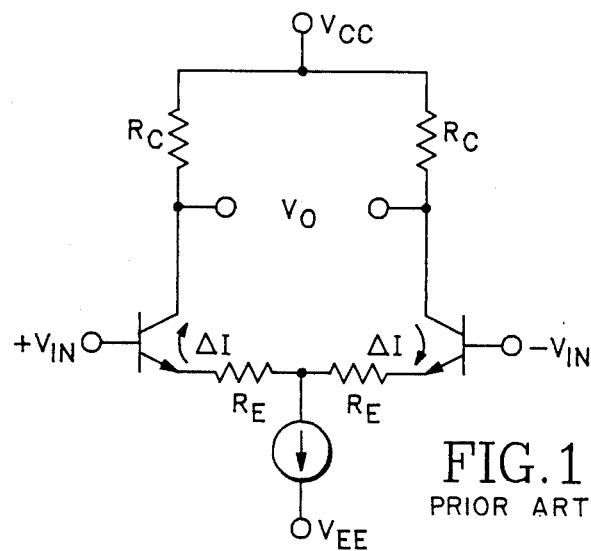
FIG. 1 is a schematic diagram of a simple differential transistor pair with collector and emitter resistances.
Figure 2:
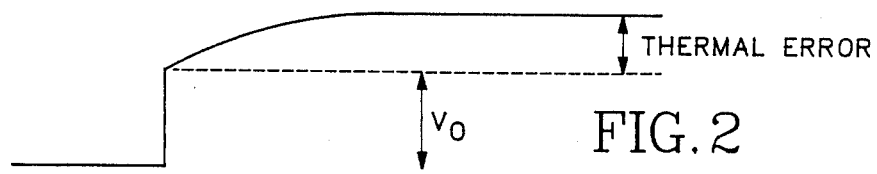
FIG. 2 is a plot of the thermally distorted output voltage of a differential transistor pair.
Figure 3:
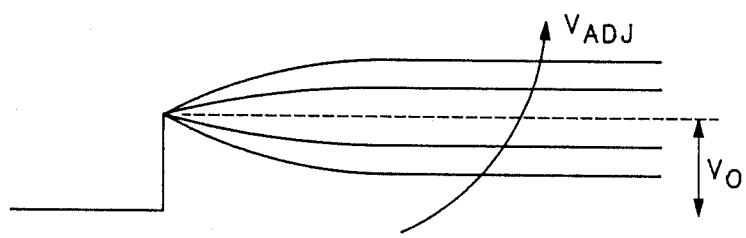
FIG. 3 is a plot of the output voltage produced by the present invention in response to the adjustment voltage.

Once an integrated circuit is fabricated, the thermal distortion may be measured. By varying $V_{ADJ}$ positive and negative with respect to $V_{REF}$ and continuously monitoring the thermal distortion, an optimum output response is achieved. The response of the output voltage and thermal distortion to changes in the adjustment voltage may be seen in FIG. 3.

Figure 5:
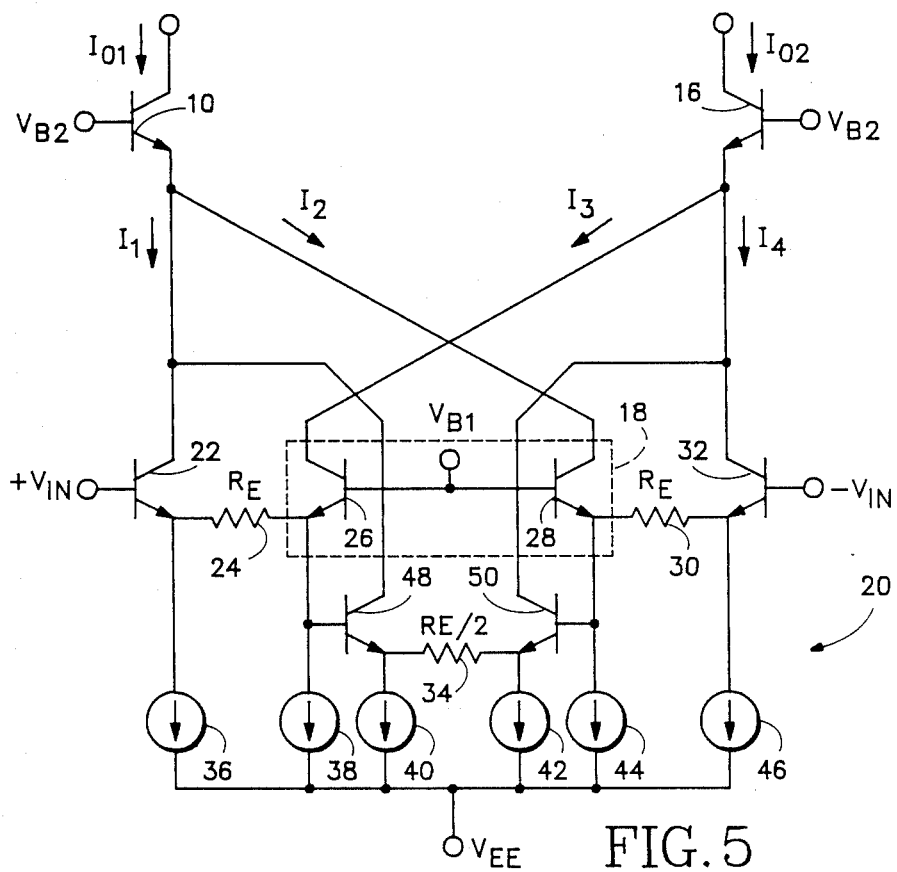
FIG. 5 is a schematic diagram of a prior art compensated $f_T$ doubler differential amplifier.

FIG. 5 shows a prior art compensated differential $f_T$ doubler amplifier. The amplifier contains two main differential amplifiers primarily comprised of transistors 22, 26, 28, 32 and emitter resistors 24 and 30. An error amplifier comprised of transistors 48 and 50 and emitter resistor 34 sense the error voltage produced by error voltage generator 18. The error voltage is simply the difference of the emitter base voltages of transistors 26 and 28. The differential output current produced by error voltage generator 18, designated $I_2$ and $I_3$, is simply added to the rest of the output differential current, designated $I_1$ and $I_4$. The summation occurs at the emitters of transistors 10 and 16. The total differential output current has reduced error current and enhanced linearity. However, the thermal distortion of the fabricated integrated circuit is fixed, and not necessarily at the minimum value.

Figure 6:
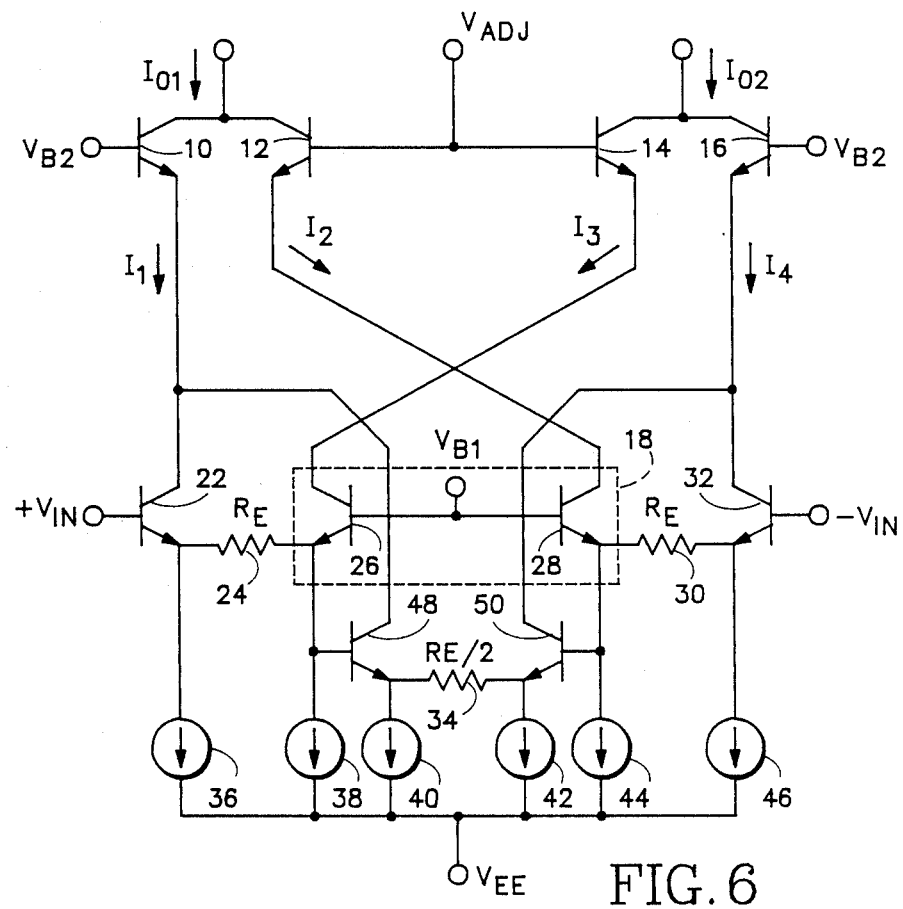
FIG. 6 is a schematic diagram of an alternative embodiment of the present invention.

FIG. 6 shows a compensated differential $f_T$ doubler amplifier with adjustable thermal distortion according to the present invention. The output currents $I_2$ and $I_3$ of the error voltage generator 18, have been segregated from the rest of the output current $I_1$ and $I_4$. Instead of being directly summed, the currents flow through transistors 10, 12, 14 and 16 before finally being summed to produce the final differential output current. The voltage source $V_{ADJ}$ is coupled to the bases of transistors 12 and 14. Changing the value of $V_{ADJ}$ changes the collector voltage of transistors 26 and 28, which form the error voltage generator. As described above, the voltage difference between $V_{ADJ}$ and the reference voltage $V_{B2}$ is an input. The output is the thermal error current produced by the error amplifier which compensates for the integrated circuit characteristics and minimizes thermal distortion.

Figure 7:
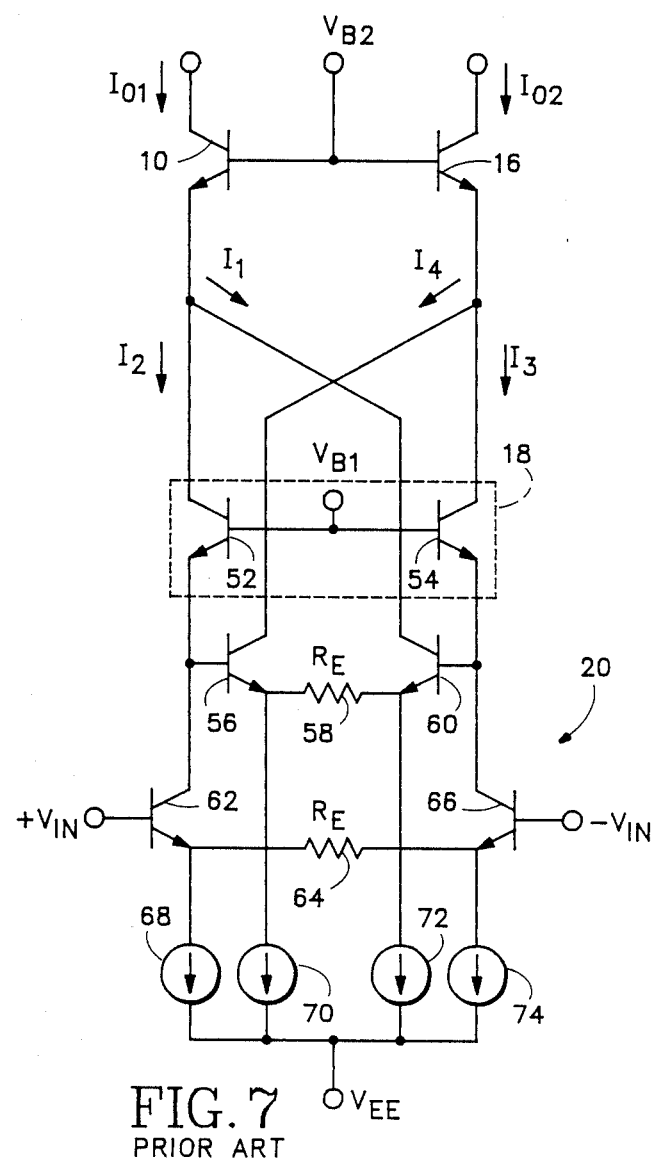
FIG. 7 is a schematic diagram of a prior art cascomp amplifier.

FIG. 7 shows a prior art cascomp amplifier. This circuit includes a main differential amplifier comprised substantially of transistors 62 and 66, and emitter resistor 64; an error amplifier comprised substantially of transistors 56 and 60; and an error voltage generator 18 comprised of transistors 52 and 54. Note that the bases of the transistors of the error voltage generator, 52 and 54 are coupled to a fixed voltage reference source $V_{B1}$. The error amplifier senses the error voltage produced by error voltage generator 18. The error voltage is simply the difference of the emitter base voltages of transistors 52 and 54. The differential output current produced by error voltage generator 18, designated $I_2$ and $I_3$, is directly added to the rest of the output differential current, which in this case is merely the error amplifier current, designated $I_1$ and $I_4$. The summation of all the currents occurs at the emitters of transistors 10 and 16. The total differential output current has reduced error current and enhanced linearity. However, as in the case of the compensated $f_T$ doubler amplifier, the thermal distortion of the fabricated integrated circuit is fixed, and not necessarily at the minimum value.

Figure 8:
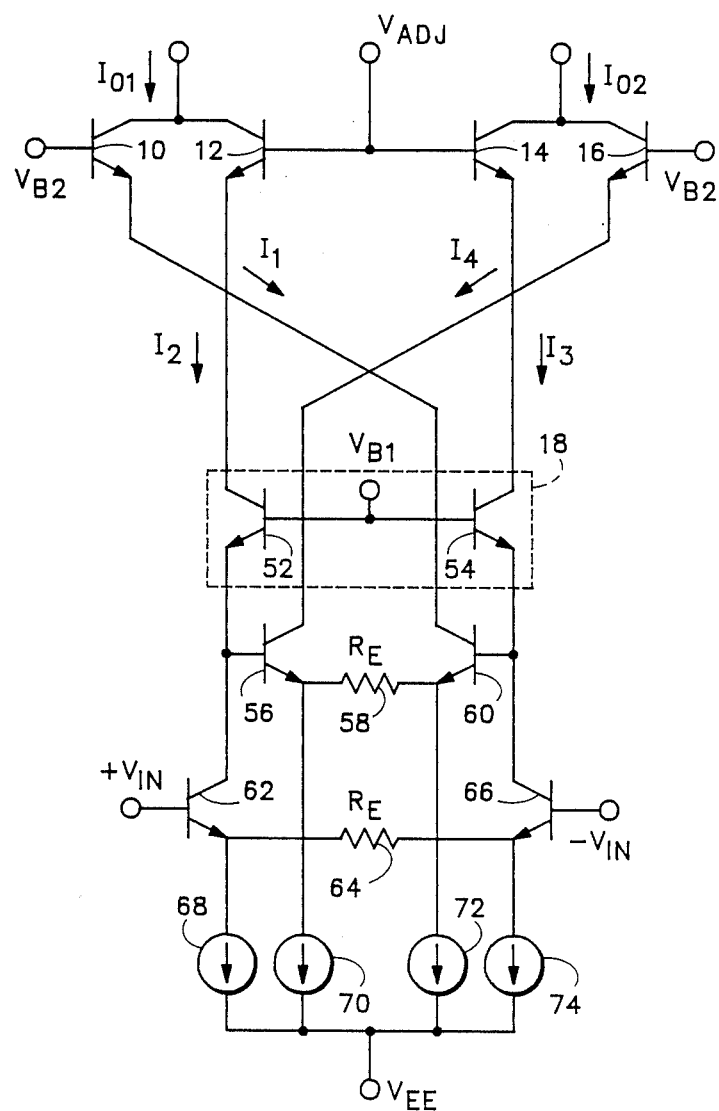
FIG. 8 is a schematic diagram of another alternative embodiment of the present invention.

FIG. 8 shows a cascomp amplifier with adjustable linearity according to the present invention. The analysis of the operation of the circuit is similar to the analysis of FIG. 6. The output currents $I_2$ and $I_3$ of the error voltage generator 18, are segregated from the error amplifier output currents $I_1$ and $I_4$. Instead of being directly summed, the currents flow through transistors 10, 12, 14 and 16 before finally being summed to produce the final differential output current. The voltage source $V_{ADJ}$ is coupled to the bases of transistors 12 and 14. Changing the value of $V_{ADJ}$ changes the collector voltage of transistors 52 and 54, which form the error voltage generator. As described above, the adjustment of $V_{ADJ}$ with respect to the reference voltage $V_{B2}$, is an input, the output of which enables the error amplifier to produce more or less thermal error current to compensate for the integrated circuit characteristics and achieve minimum thermal distortion.

It has been shown that an amplifier which is compensated for linearity may be adjusted to achieve minimum thermal distortion possible, overcoming detrimental integrated circuit characteristics which may not be possible to adequately model in an electrical simulation. Further, the method and apparatus for adjusting the thermal distortion requires only a few additional devices, plus one additional external pin connection on the integrated circuit. The adjustment voltage does not require a significant drive capability since it is coupled to the bases of two transistors, which have relatively high impedance.

While I have shown and described a preferred embodiment and two alternative embodiments of the present invention, it will be appararent to those skilled in the art that many changes and modifications may be made without departing from my invention in its broader aspects. For example, any linearized differential amplifier may be used as long as the output current from the error voltage generator may be segregated from the output current from the rest of the amplifier. Therefore, the appended claims cover all such changes and modifications as fall therewithin.

I claim:

1. A method for minimizing the self heating distortion of a differential transconductance amplifier whose output current is linearized by the output current of an error amplifier, said differential transconductance amplifier having an error voltage generator for providing an error voltage to the error amplifier and through which flows at least part of the output current of the differential transconductance amplifier, comprising:
   a. separating a first differential output current into a first differential current flowing through the error voltage generator and a second differential current;
   b. directing the first differential current to the emitters of a first pair of transistors whose bases are coupled together and to an adjustment voltage source;
   c. directing the second differential current to the emitters of a second pair of transistors whose bases are coupled together and to a reference voltage source;
   d. summing the collector currents of the first and second transistor pairs to form a second differential output current; and
   e. changing the value of the adjustment voltage source in order to change the power dissipation of the error voltage generator and the resultant error voltage, thereby controlling the output of the error amplifier and the resultant thermal distortion of the differential transconductance amplifier.

2. An apparatus for adjusting the self heating distortion of a differential transconductance amplifier whose output current is linearized by the output current of an error amplifier, said differential transconductance amplifier having an error voltage generator for providing an error voltage to the error amplifier and through which flows at least part of the output current of the differential amplifier, comprising:
   a. a first pair of transistors each having a base, a collector and an emitter, the bases being coupled together and to an adjustment voltage source, the emitters being coupled to the error voltage generator;
   b. a second pair of transistors each having a base, a collector and an emitter, the bases being coupled together and to a reference voltage source, the emitters being coupled to the differential transconductance amplifier, the collectors being coupled to the collectors of said first pair of transistors to form a differential current output; and
   c. means for changing the value of the adjustment voltage source in order to change the power dissipation of the error voltage generator and the resultant error voltage, thereby controlling the output of the error amplifier and the resultant thermal distortion of the differential transconductance amplifier.

3. A differential transconductance amplifier with means for adjusting self heating distortion comprising:
   a. a differential transconductance amplifier whose output current is linearized by the output current of an error amplifier, said differential transconductance amplifier having an error voltage generator for providing an error voltage to the error amplifier and through which flows at least part of the output current of the differential transconductance amplifier and first and second pairs of output current terminals;
   b. a first pair of transistors each having a base, a collector and an emitter, the bases being coupled together and to an adjustment voltage source, the emitters being coupled to the first pair of output current terminals;
   c. a second pair of transistors each having a base, a collector and an emitter, the bases being coupled together and to a reference voltage source, the emitters being coupled to the second pair of output current terminals, the collectors being coupled to the collectors of said second pair of transistors to form a differential current output; and
   d. means to change the value of the adjustment voltage source in order to change the power dissipation of the error voltage generator and the resultant error voltage, thereby controlling the output of the error amplifier and the resultant thermal distortion of the differential transconductance amplifier.

4. A differential transconductance amplifier as in claim 3 wherein the compensated differential amplifier is a differential $f_T$ doubler amplifier.

5. A differential transconductance amplifier as in claim 3 wherein the compensated differential amplifier is a cascomp amplifier.

* * * * *